United States Patent
Kittl et al.

(10) Patent No.: US 9,831,323 B2
(45) Date of Patent: Nov. 28, 2017

(54) STRUCTURE AND METHOD TO ACHIEVE COMPRESSIVELY STRAINED SI NS

(71) Applicant: Samsung Electronics Co., Ltd., Suwon-si, Gyeonggi-do (KR)

(72) Inventors: Jorge A. Kittl, Round Rock, TX (US); Ganesh Hegde, Austin, TX (US); Robert Christopher Bowen, Austin, TX (US); Borna J. Obradovic, Leander, TX (US); Mark S. Rodder, Dallas, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/267,134

(22) Filed: Sep. 15, 2016

(65) Prior Publication Data
US 2017/0263728 A1    Sep. 14, 2017

Related U.S. Application Data

(60) Provisional application No. 62/307,363, filed on Mar. 11, 2016.

(51) Int. Cl.
| H01L 29/78 | (2006.01) |
| H01L 29/66 | (2006.01) |
| H01L 29/201 | (2006.01) |
| H01L 29/06 | (2006.01) |
| H01L 21/02 | (2006.01) |
| H01L 21/306 | (2006.01) |
| H01L 21/04 | (2006.01) |
| H01L 21/465 | (2006.01) |

(52) U.S. Cl.
CPC .... *H01L 29/6681* (2013.01); *H01L 21/02439* (2013.01); *H01L 21/02532* (2013.01); *H01L 21/02603* (2013.01); *H01L 29/0673* (2013.01); *H01L 29/6653* (2013.01); *H01L 29/66553* (2013.01); *H01L 29/7848* (2013.01); *H01L 29/7853* (2013.01); H01L 21/0245 (2013.01); H01L 21/02447 (2013.01); H01L 21/02485 (2013.01); H01L 21/0475 (2013.01); H01L 21/30604 (2013.01); H01L 21/465 (2013.01)

(58) Field of Classification Search
CPC .... H01L 29/0669–29/068; H01L 2924/13061; Y10S 977/938
See application file for complete search history.

(56) References Cited

U.S. PATENT DOCUMENTS

| 7,700,416 B1 | 4/2010 | Clifton et al. |
| 8,361,867 B2 | 1/2013 | Clifton |

(Continued)

*Primary Examiner* — Evan Pert
*Assistant Examiner* — Changhyun Yi
(74) *Attorney, Agent, or Firm* — Renaissance IP Law Group LLP

(57) ABSTRACT

A stack for a semiconductor device and a method for making the stack are disclosed. The stack includes a plurality of sacrificial layers in which each sacrificial layer has a first lattice parameter; and at least one channel layer that has a second lattice parameter in which the first lattice parameter is less than or equal to the second lattice parameter, and each channel layer is disposed between and in contact with two sacrificial layers and includes a compressive strain or a neutral strain based on a difference between the first lattice parameter and the second lattice parameter.

20 Claims, 8 Drawing Sheets

(56) References Cited

U.S. PATENT DOCUMENTS

| | | |
|---|---|---|
| 9,236,474 B2 | 1/2016 | Morin |
| 9,515,138 B1* | 12/2016 | Doris .................... H01L 29/267 |
| 2016/0380104 A1* | 12/2016 | Cohen ................. H01L 29/7856 |
| | | 257/76 |

* cited by examiner

STRUCTURE AND METHOD TO ACHIEVE COMPRESSIVELY STRAINED SI NS

CROSS-REFERENCE TO RELATED APPLICATION

This patent application claims the priority benefit under 35 U.S.C. §119(e) of U.S. Provisional Patent Application No. 62/307,363, filed on Mar. 11, 2016, the disclosure of which is incorporated herein by reference in its entirety.

BACKGROUND

Conventional techniques to form compressively strained Si channels for FinFET devices may not be applicable to form compressively strained horizontal nanosheet (hNS) or compressively strained horizontal nanowire (hNW) FETs. Epitaxial SiGe source/drain (SD) structures have been used to compressively strain the silicon channels of planar and FinFET devices. The SiGe epi layers that are grown to form the compressive strain have lattice structures that are coherent and have registry throughout the volume of the grown epi layers. The processes that are used to grow the SiGe epi layers are well-tuned processes in that the SiGe epi grows with a high degree of uniformity at all exposed surfaces in a given SD and the fact that all of the exposed surfaces within the given SD are connected and part of a single crystal. For hNS (or hNW) FETs, if SD structures are regrown, in almost all cases growth within a given SD structure starts at several surfaces that are disconnected (e.g. bottom and ends of each NS (or NS)) and without registry. The SD structure resulting from the merger of all of the separate crystal growths will likely not be a single crystal, but will have defects, such as low-angle grain boundaries, stacking faults, etc. Moreover, if SiGe is conventionally used for the sacrificial layers in the starting stack, a tensile strain tends to be induced in the silicon channels of an hNS (or the hNW) device.

SUMMARY

An example embodiment provides a stack for a semiconductor device that may include a plurality of sacrificial layers in which each sacrificial layer has—in its relaxed state—a first (intrinsic) lattice parameter; and at least one channel layer that has—in its relaxed state—a second (intrinsic) lattice parameter in which the first lattice parameter is less than or equal to the second lattice parameter, and each channel layer may be disposed between and in contact with two sacrificial layers and includes a compressive strain or a neutral strain based on a difference between the first lattice parameter and the second lattice parameter. In one embodiment, the sacrificial layers may include SiGe:C, SiC, BeZnSe or a combination thereof, and the at least one channel layer may include silicon.

An example embodiment provides a stack for a semiconductor device may include an underlayer; and a stack of a plurality of sacrificial layers and at least one channel layer on the underlayer in which a sacrificial layer may be in contact with the underlayer, each sacrificial layer in its ideal relaxed state may have a first (intrinsic) lattice parameter, the at least one channel layer may have in its ideal relaxed state a second (intrinsic) lattice parameter, the first lattice parameter may be smaller than or equal to the second lattice parameter, and each channel layer may be disposed between and in contact with two sacrificial layers and may include at the end of the processing a compressive strain or a neutral strain based on a difference between the first intrinsic lattice parameter and the second intrinsic lattice parameter. In one embodiment, the sacrificial layers may include SiGe:C, SiC, BeZnSe or a combination thereof, and the at least one channel layer may include silicon.

An example embodiment provides a method to form a stack for a semiconductor device in which the method may include: providing an underlayer; and forming a stack of a plurality of sacrificial layers and at least one channel layer on the underlayer in which a sacrificial layer may be in contact with the underlayer, each sacrificial layer in its ideal relaxed state has a first intrinsic lattice parameter, the at least one channel layer may include in its ideal relaxed state a second intrinsic lattice parameter in which the first intrinsic lattice parameter is smaller than or equal to the second intrinsic lattice parameter, and each channel layer may be disposed between and in contact with two sacrificial layers and includes a compressive strain at the end of the processing based on a difference between the first intrinsic lattice parameter and the second intrinsic lattice parameter. In one embodiment, the sacrificial layers may include SiGe:C, SiC, BeZnSe or a combination thereof, and the at least one channel layer may include silicon.

BRIEF DESCRIPTION OF THE DRAWINGS

In the following section, the aspects of the subject matter disclosed herein will be described with reference to exemplary embodiments illustrated in the figures, in which.

DETAILED DESCRIPTION

Figure 1A:
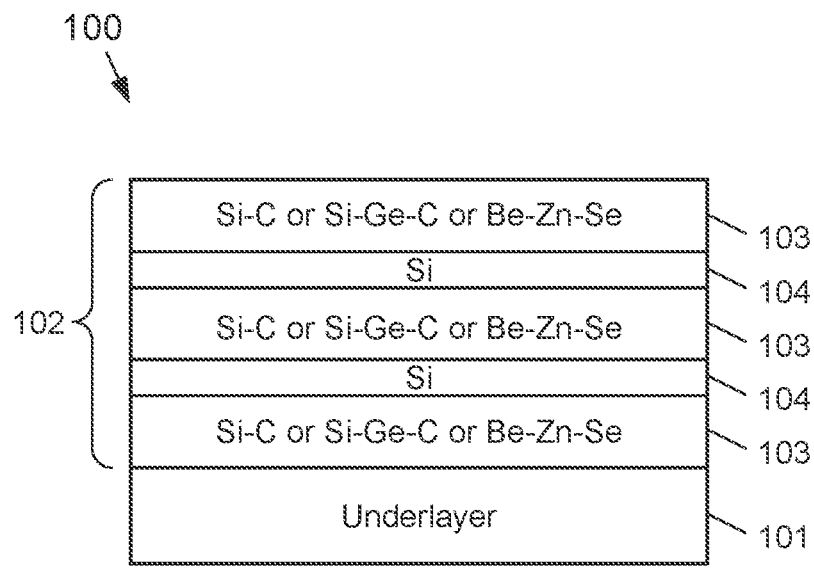
FIGS. 1A-1L respectively depict cross-sectional view at selected stages during formation of an example embodiment of an NS device having a compressively strained channels according to the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing particular exemplary embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement the teachings of particular embodiments disclosed herein.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein, but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the claimed subject matter.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The subject matter disclosed herein relates to devices, such as, but not limited to, field effect transistors (FETs), that contain one or more stacks of nanosheets (NSs) and/or one or more stacks of nanowires (NWs). As used herein, the term "nanosheet" means a conductive structure having a cross-sectional area that is substantially perpendicular to the direction of current transport through the nanosheet, and in which one of the Cartesian cross-sectional dimensions is noticeably smaller in comparison to the other dimension. For example, a nanosheet may include a conductive structure having a cross-sectional area in which one of the Cartesian cross-sectional dimensions ranges from a few nanometers to about 20 nm, and the other Cartesian cross-sectional dimensions ranges from about 15 nm to about 70 nm. Also as used herein, the term "nanowire" means a conductive structure having a cross-sectional area that is substantially perpendicular to the direction of current transport through the nanowire and in which the Cartesian cross-sectional dimensions are similar and small. For example, a nanowire may include a conductive structure having a cross-sectional area in which the Cartesian cross-sectional dimensions may range from a few nanometers to about 20 nm. As used herein, the terms "nanosheet," "NS," "nanowire" and "NW" may be used interchangeably. Moreover, if the term "nanosheet" or the term "nanowire" is used without the other term, it should be understood that the other term is also impliedly included. Further, the terms "nanowire" and "nanosheet" may be referred to herein as layers. The term "stack" as used herein may refer to a plurality of sacrificial layers and a plurality of channel layers having dimensions that are consistent with being either nanosheets and/or nanowires, and that are formed in a stack of an alternating sequence of sacrificial layers and channel layers. Further still, the phrases "NS release," "NW release," and "release" as used herein refer to removal of the sacrificial layers from the initial stack. Reference herein to the lattice parameter of a sacrificial layer means that the lattice parameter of the sacrificial layer is what it would be if relaxed. As used there, the expression "at the end of the processing" may refer to any step in the fabrication flow following a deep source and drain recess or similar cuts of the stack.

The subject matter disclosed herein also relates to a structure and a method to induce a compressively strained silicon channel NS (or HW) FET device. One embodiment provides a compressively strained silicon channel NS FET that does not rely on SD stressors to form the compressive strain in the silicon NSs. Another embodiment provides a compressively strained silicon channel NS FET that may use SD stressors to induce additional compressive strain to the silicon channels of the device. Yet another embodiment provides a pFET device having a channel material that may be silicon instead a non-Si material, such as SiGe, thereby simplifying integration of the pFET device as a pMOS device into a CMOS integrated circuit.

As discussed herein, lattice parameters are mainly considered to be the lattice parameter in the direction along the channel (parallel to transport direction in the channel). For example, there is a lattice parameter of a stack as grown that is the same lattice parameter as the lattice parameter of the underlayer because stack grown on underlayer. There is also a lattice parameter that the stack adopts if the whole stack is allowed to relax elastically, i.e., when deep SD recesses are formed, and distance between adjacent SD recesses is, for example, less than 200 nm. There is a lattice parameter that a layer would have if the layer is in its intrinsic relaxed state (a material property), which is referred to herein as the "intrinsic lattice parameter: of the material or of the layer (a material property). Thus, when describing layers with different (intrinsic) lattice parameters within a stack herein, what is being referred to is the lattice parameter that the layers would have if allowed to relax independently, i.e., the lattice parameter of each layer in its "relaxed state," which is a material property and may, in some cases, never be actually realized during the process. It is also noted that in a stack that is grown epitaxially (as all stacks described herein) all layers tend to take effectively the same lattice parameter. The lattice parameter of the stack is, right after epitaxial growth of the stack, substantially the same lattice parameter as the underlayer or substrate on which the stack is grown. After processing, such as after a deep etch of the stack to create source and drain deep recesses, the stack may relax elastically and adopt a different lattice parameter than the lattice parameter of the as-grown stack. The lattice parameter is still in this case substantially uniform through the height of the stack.

The subject matter disclosed herein also provides an NS FET device that uses a SiC/Si stack, a BeZnSe/Si stack or a SiGe:C/Si stack as starting stack. The starting stack of sacrificial and silicon layers adopts a lattice parameter that is smaller than the lattice parameter of silicon if the whole stack is allowed to relax elastically thus providing a compressive strain in the channels of the final structure. In some embodiments, the starting stack of sacrificial and silicon layers adopts a lattice parameter that is substantially equal to the lattice parameter of silicon, if the stack is allowed to relax elastically thereby providing a neutral strain or substantially neutral strain in the silicon channels in the final structure.

The starting stack may be etched to form a deep SD recess, or cut, allowing the stack to elastically relax. Due to the elastic relaxation induced by the deep SD recess or cut, the stack adopts its relaxed lattice parameter which is smaller (or equal) than the lattice parameter of the channel material in its relaxed state, resulting in a compressive strain in the channel layers. In one embodiment, internal spacers may be formed after the deep SD recess at the ends of the sacrificial layers to optimize $C_{para}$, $R_{para}$ associated with the final structure. In this regard, the thicknesses of the internal spaces, that is, the lengths of the internal spaces along the silicon channel, may be controlled to achieve a desired level of strain in the final structure and to achieve an optimized $C_{para}$, $R_{para}$. In one embodiment, the compressive strain induced in the silicon channels may be held in place by regrowth of a SD structure, which may be formed from Si, SiGe, SiGe:C or combinations thereof, prior to nanosheet release. Nano-sheet release may be provided by selectively etching the sacrificial layers to the silicon channel layers. In one embodiment, the release may be performed as part of a replacement gate process. The regrown SD structure partially maintains the compressive strain in the channel when the sacrificial layers are removed selectively to the channel layers at nanosheet release.

FIGS. 1A-1L respectively depict cross-sectional view at selected stages during formation of an example embodiment of an NS device 100 having a compressively strained channels according to the subject matter disclosed herein. The NS device 100 may be utilized in semiconductor devices, such as, but not limited to, FETs. FIG. 2 depicts a flow diagram of an exemplary method 200 to form the example embodiment of the NS device 100 according to the subject matter disclosed herein.

At 201 in FIG. 2, an underlayer 101 may be formed on, for example, a substrate (not shown), using well-known deposition techniques. As used herein, the term "underlayer" may mean a strain-relaxed buffer (SRB), an elastically strained buffer, or any underlayer material comprising a lattice parameter that may substantially match the lattice parameter that the to-be-formed stack would have if the stack in isolation was allow to relax coherently. Typically, an underlayer may be substantially a single crystal. Examples of underlayer materials may include Si, SiGe, SiGe alloys or other semiconductor alloys. In one embodiment, the underlay may simply be the silicon substrate.

Also at 201, a stack 102 (FIG. 1A) of sacrificial layers 103 and channel layers 104 are epitaxially formed on the underlayer 101 using well-known deposition techniques. The sacrificial layers 103 and the channel layers 104 are formed in an alternating sequence in which a sacrificial layer 103 is formed directly on the underlayer 101. In one embodiment, the stack 102 comprises a top sacrificial layer 103 formed on a channel layer 104. The number of alternating layers of the stack 102 may be selected based on the desired configuration of the final device. It should be understood that the stack 102 does not plastically relax or substantially plastically relax by formation of defects that are generated in the stack at any point during method 200. Thus, after stack growth, the whole stack adopts substantially the same lattice parameter as the underlayer.

The respective thicknesses, material properties (e.g., elastic parameters) and the respective lattice parameters of the sacrificial and channel layers may physically combine in the stack 102 so that the stack 102, if allowed to relax elastically, may have an overall lattice parameter that is based on a weighted average of the lattice parameters of the sacrificial and channel layers. The weighted average of the lattice parameters will be the lattice parameter that the stack of nanosheets would have if the stack in isolation was allowed to relax coherently. The resulting strain in the channel layers, after elastic relaxation of the stack, is then a function of the respective layer thicknesses of the sacrificial and channel layers, and their respective compositions, as well as of the elastic properties of the layers. A larger difference in lattice parameter between the sacrificial and channel layers results in higher levels of resulting strain in the channel after elastic relaxation of the stack. In one embodiment, the lattice parameter of stack 102 when allowed to relax coherently is less than or equal to the lattice parameter of silicon. In one embodiment, the material used for the sacrificial layers 103 is selected so that the intrinsic lattice parameter of the sacrificial layers 103 is less than or equal to the lattice parameter of the silicon channel layers 104. In one embodiment, the silicon channel layers 104 may have a thickness in the range of about 2 nm to about 6 nm, and the sacrificial layers 103 may have a thickness in the range of about 5 nm to about 30 nm. In one embodiment, the sacrificial layers 103 may have a thickness in the range of about 9 nm to about 20 nm.

Suitable materials that may be selected for the sacrificial layers 103 include SiC, BeZnSe, SiGe:C or combinations thereof. For example, a SiGe:C combination for a sacrificial layer 103 may be used that has a Ge content of about 20 to about 40%, and C content of about 1% to about 4% in which the combination is selected for a resulting lattice parameter that is less than or about equal to the lattice parameter of silicon. Such may be the case if the Ge (%) content is less than or about equal to about nine (9) times the C (%) content (i.e., Ge (%)<9 C (%) or Ge (%)~9 C (%)). Accordingly, for a sacrificial layer having 20% Ge, C content in excess of 2.5% may result in a smaller lattice parameter than that of silicon.

Figure 1B:
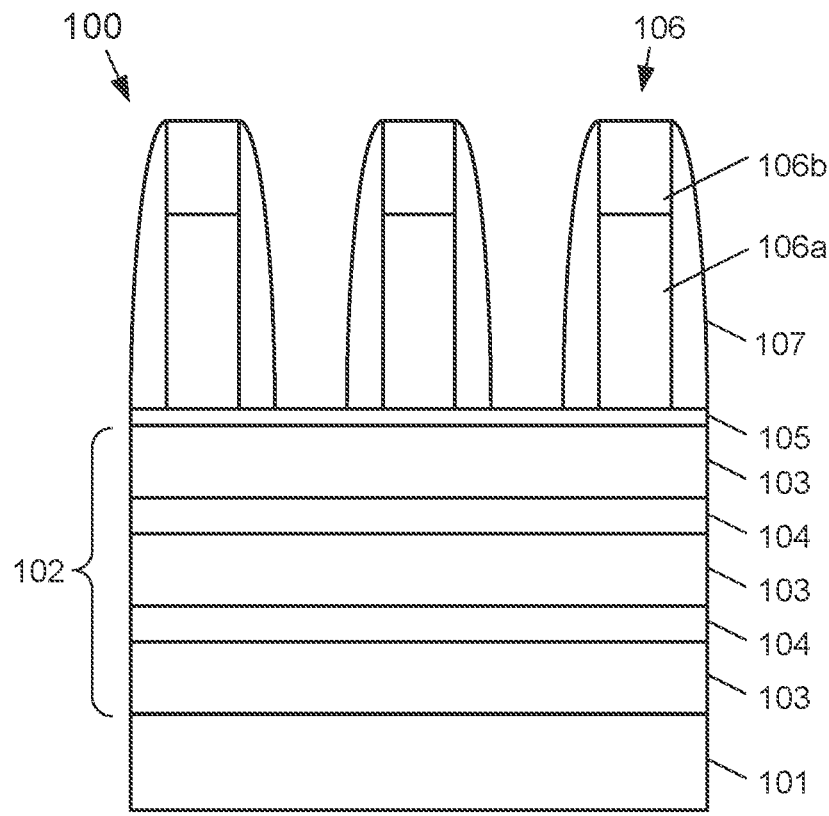
Figure 2:
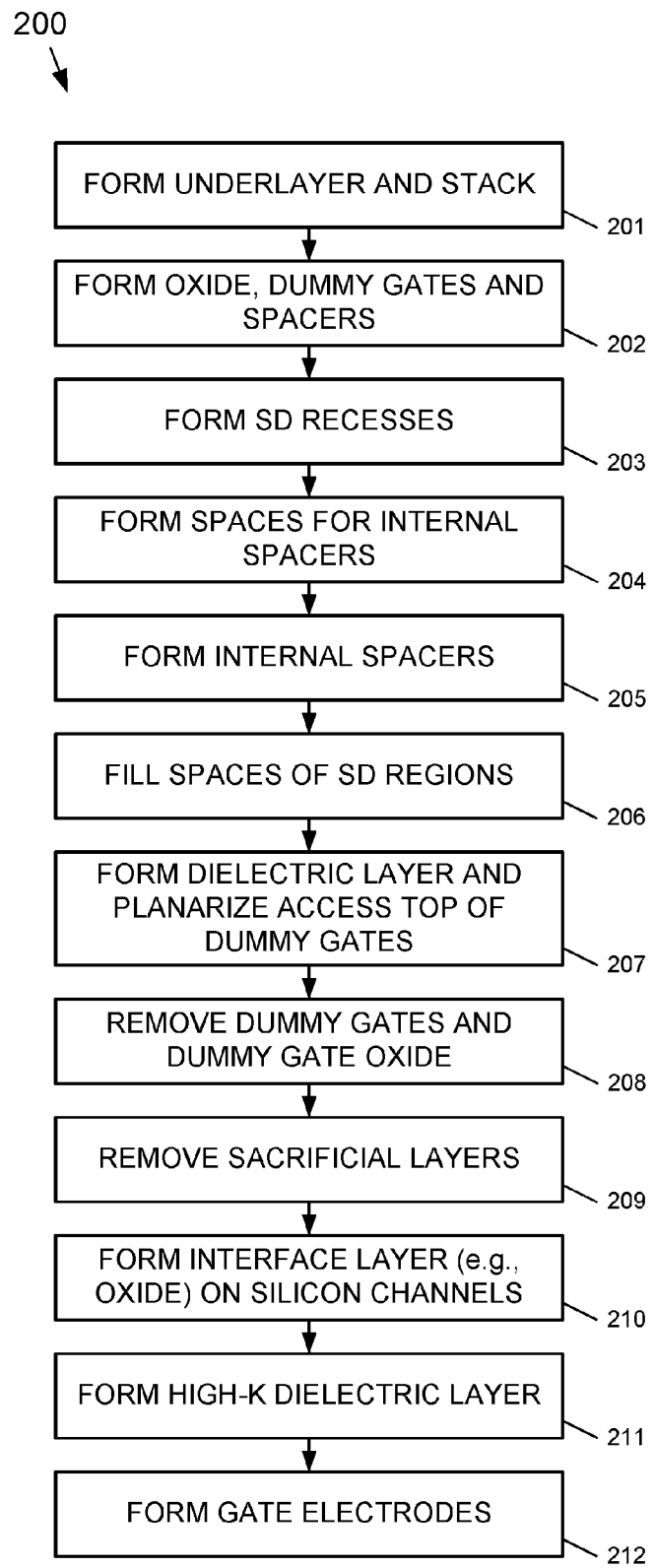
FIG. 2 depicts a flow diagram of an exemplary method to form the example embodiment of the NS device according to the subject matter disclosed herein.

At 202 in FIG. 2, an oxide layer ("dummy gate oxide") 105 may be formed on the top sacrificial layer 103 of the stack 102 as depicted in FIG. 1B. Dummy gates 106 and spacers 107 may be formed on the oxide layer 105. The dummy gates 106 may include a polysilicon layer 106a and a mask 106b. Spacers 107 may be formed on the sidewalls of the dummy gates 106.

Figure 1C:
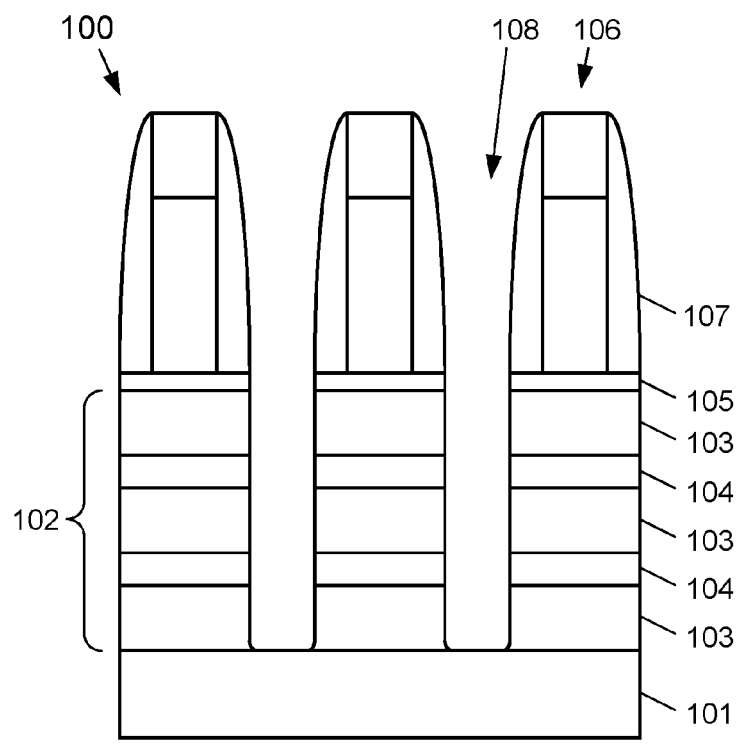

At 203 in FIG. 2, SD recesses (or structure cuts) may be formed in the stack 102 using well-known techniques to form spaces 108 for source/drain regions (FIG. 1C). The spaces 108 for the SD regions extend through the stack 102 to about the underlayer 101. The regions of stack material left between the spaces 108 for the SD regions are relatively short (e.g., less than about 200 nm), so that the remaining regions of stack material are substantially completely elastically relaxed in the direction normal to the cuts. The strain in the channel layers of the regions of remaining stack material is primarily determined by elastic deformation of the stack 102 at the point that the SD recesses (or structure cuts) are formed (i.e., at 203 in FIG. 2), and is a result of the effect of the sacrificial layers straining the channel layers. That is, the strain in the channel layers is a function of the respective thicknesses of the sacrificial and channel layers, and their respective compositions. A desired portion of the strain state of the remaining regions of stack material can be maintained throughout the rest of a manufacturing flow.

Figure 1D:
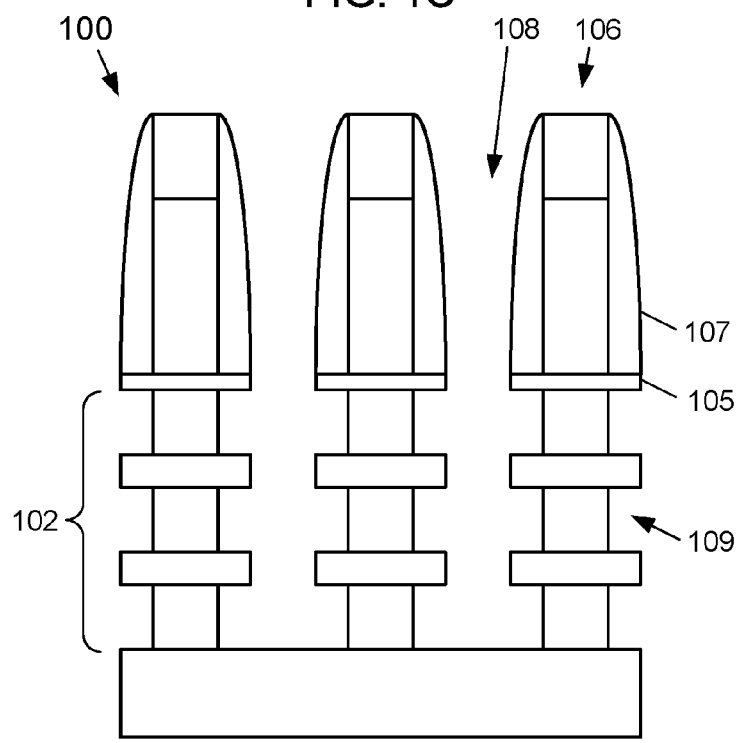
Figure 1E:
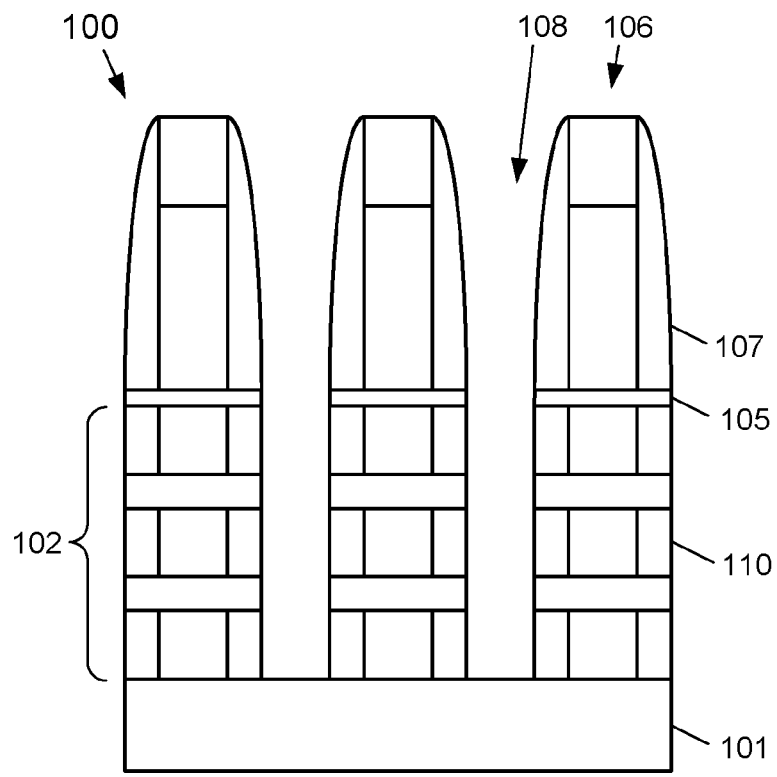
Figure 1F:
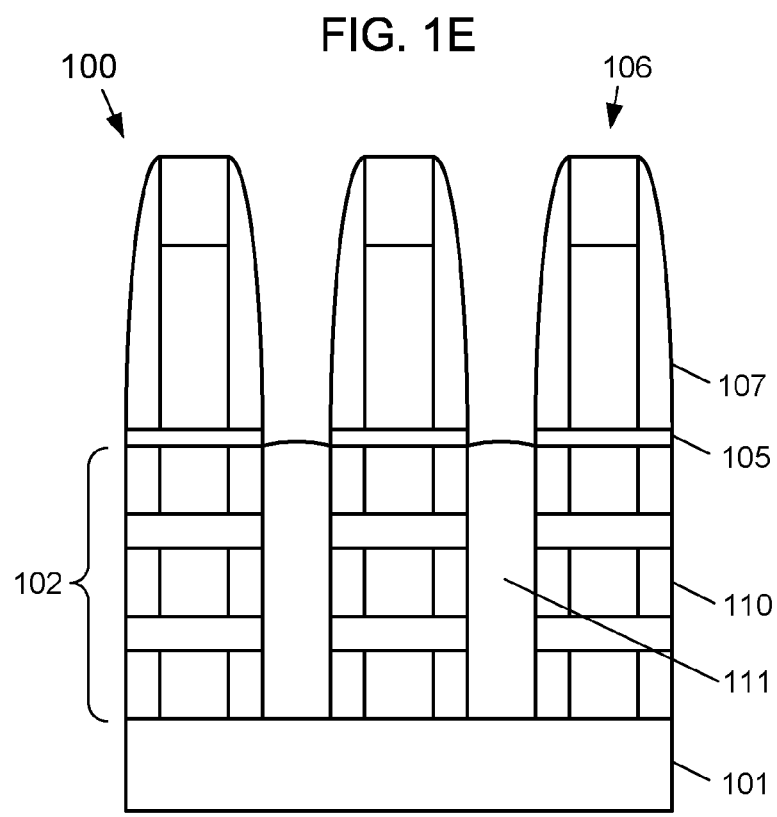

At 204 in FIG. 2, the edges of the sacrificial layers 103 that were exposed when the spaces 108 for the SD regions were formed may be etched, or undercut, selectively so that the channel material is substantially not etched, using a well-known technique to remove a portion 109 of each sacrificial layer 103 between neighboring channel layers 104 without any significant removal of material from the channel layers 104 to subsequently form internal spacers, as depicted in FIG. 1D. The depth of the etching of the sacrificial layers along the length of the silicon channel layers is selected to optimize $C_{para}$ and $R_{para}$, and the desired strain in the final structure. Thinner (or shorter) internal spacers may provide a lower parasitic resistance, result in higher remaining strain in the channel layers, but higher a parasitic capacitance.

As the sacrificial layer 103 is etched back from the exposed edge of the stack, the ends of channel layers 104 may elastically relax to the natural lattice parameter of silicon because the portions of the sacrificial layers 103 that have been etched away no longer impart the lattice parameter (and strain) of the sacrificial layer 103 to the channel layers 104. For an exemplary embodiment in which a channel layer length is about 20 nm, the internal spacer width (i.e., the amount of sacrificial material that is undercut), should be limited to, for example, be less than about 8 nm. As the length of the channel material decreases from about 20 nm, the undercut of the sacrificial layer should be limited to be less than about 5 nm. In some embodiments, with still shorter channels, the undercut of the sacrificial layer should be limited to be less than 3 nm. The strain in channel layers is controlled by the relaxed state of the whole stack itself (before release), which in turn is controlled by the thicknesses and composition of the channel and sacrificial layers.

At 205 in FIG. 2, internal spacers 110 are formed in the recesses 109 (FIG. 1E) of the sacrificial layers 103. The internal spacers 110 may include, but are not limited to, for example, silicon nitride or a lower-k dielectric material such as, but not limited to SiOCH, SiOCN or SiBCN.

At 206 in FIG. 2, a well-known epitaxial regrowth technique may be used to fill the spaces 108 (FIG. 1F) of the SD regions with a semiconductor material 111. The semiconductor material 111 may be formed from Si, SiGe, SiGe:C or combinations thereof. Formation of the SD regions may be done in a way to maintain the source/drain regions substantially in a relaxed state and to not change substantially the strain state in the channel.

Figure 1G:
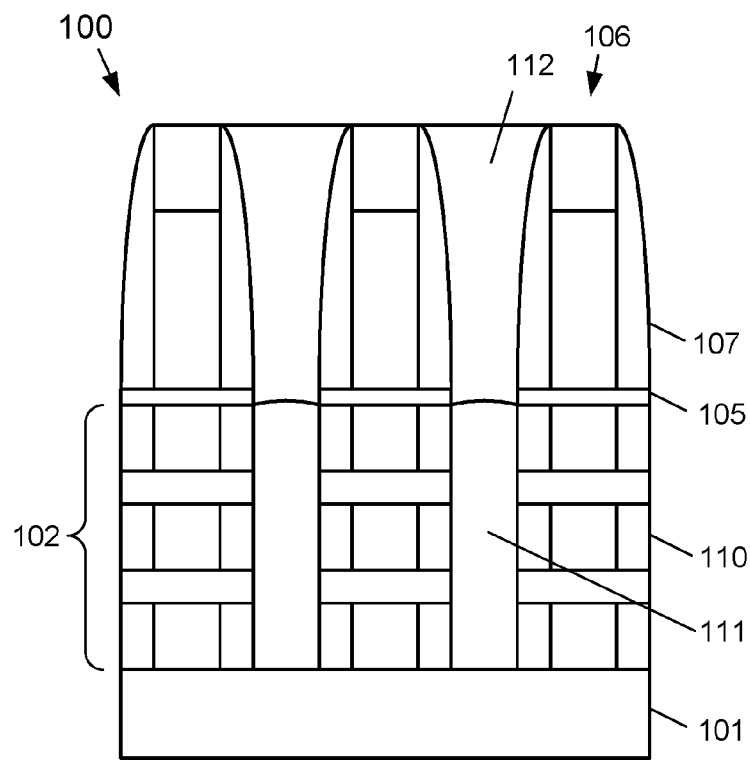

At 207 in FIG. 2, a dielectric layer 112 may be formed and planarized using well-known techniques on the dummy gates 106 and the semiconductor material 111 (FIG. 1G).

Figure 1H:
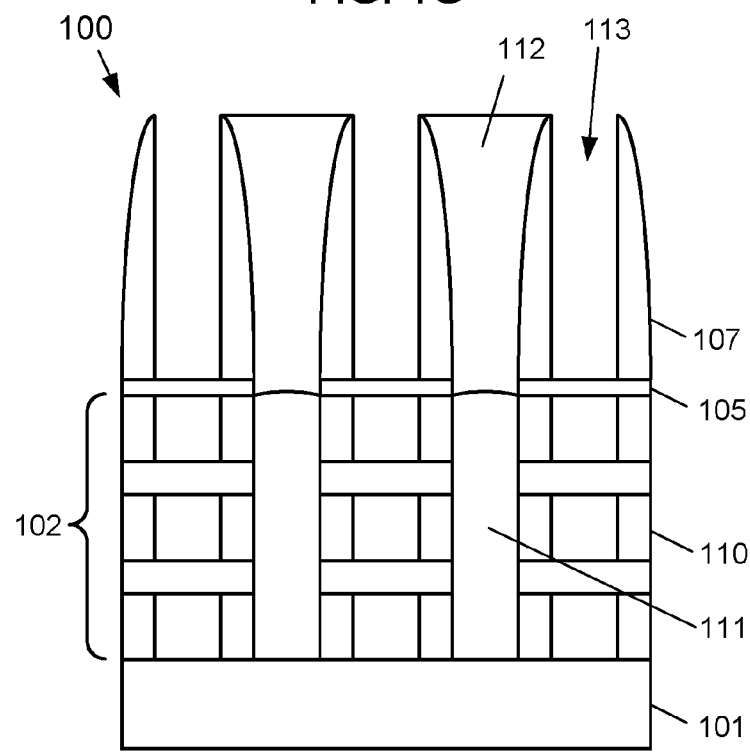

At 208 in FIG. 2, the dummy gates 106 and dummy gate oxide 105 may be removed as part of a well-known replacement gate process to form spaces 113 (FIG. 1H).

Figure 1I:
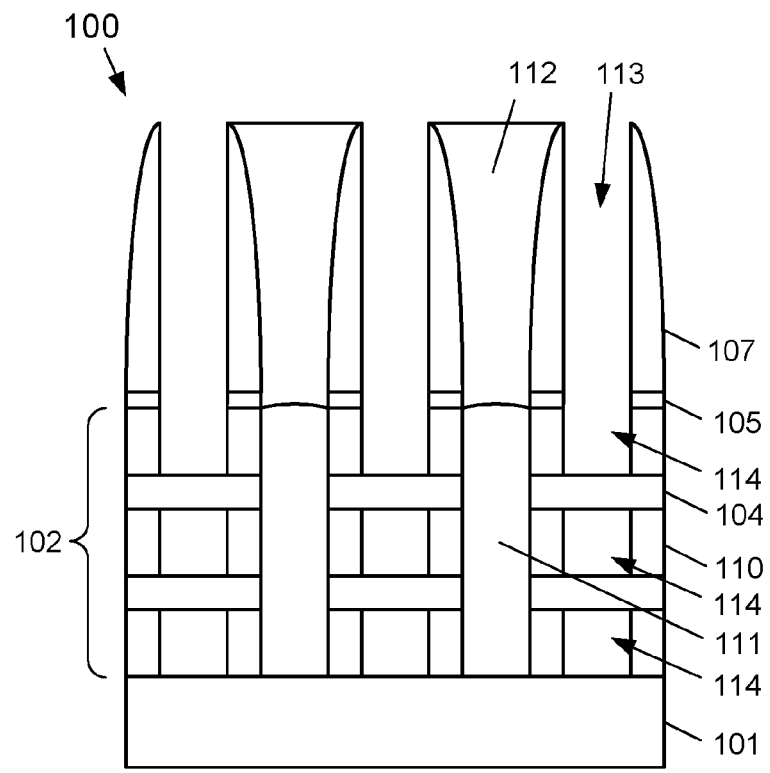

At 209 in FIG. 2, the sacrificial layers 103 may be removed to form spaces 114 by selectively etching the sacrificial layers 103 to the silicon channel layers 104 (FIG. 1I). For example, a KOH solution may be used to selectively etch SiC to Si by electrochemically etching at a potential at which silicon is passivated, but SiC is not. In one embodiment, removal of the sacrificial layers 103 may be part of, for example, the replacement gate process. In another embodiment, selective well-known wet etches of SiGe layers may be adapted and are suitable for the etching of SiGe:C layers selectively to Si channel layers.

At release, it is important that the geometry and boundary conditions are maintained so that the strain is kept in the silicon channels 104. For processes, such as described herein in which a SD structure is grown epitaxially before release, then the SD structure may help maintain the strain in the channels after release. Additionally, overall mechanical considerations may be taken into account to form compressively strained silicon channel NS devices. For example, if a tall SD pillar is coupled to the silicon channels on only one side of the silicon channels, the tall SD pillar may "bend" at release based on the channel stress. If, however, SD pillars are placed symmetrically or substantially symmetrically on both sides of the silicon channels, then compressive strain of the silicon channels will be balanced or substantially balanced at both ends of the silicon channels and the SD pillars will not significantly bend upon release.

In one embodiment, the SiC layers may include a slight n-type doping or close to intrinsic properties and illumination may be used during the etch. If the SiC layer includes p-type dopants, then in some situations the SiC layer may be etched in the dark. Selective etches to remove the sacrificial layers may also be used in the case in which the stack is made of Si channel layers and SiGe:C sacrificial layers, or for stacks made of Si channel layers and BeZnSe sacrificial layers.

After removal of the sacrificial layers 103, the strain in the channel layers 104 is re-distributed so that the strain in each channel layer 104 becomes substantially homogeneous. For a balanced configuration, the stress, which is force per unit area, is approximately inversely proportional to the NW cross-section because the force along the NS. Thus, the strain in a channel layer 104 will be uniform as long as the cross-sectional area of the channel layer is uniform. Otherwise, the strain in a channel layer 104 will be inversely proportional to the cross-sectional area of the channel layer. After release, selective trimming of the cross-sectional area of a channel layer may be performed to increase channel strain (i.e., channel strain is inversely proportional to the cross-section area of the channel layer).

Figure 1J:
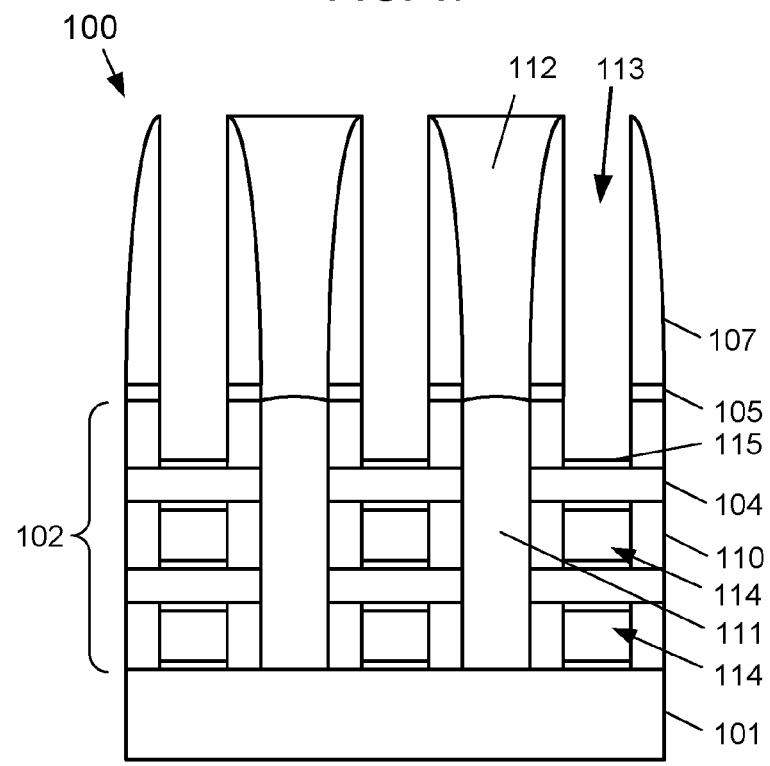

At 210 in FIG. 2, an interface layer such as an oxide layer 115 may be formed on the silicon channel layers 104 (FIG. 1J).

Figure 1K:
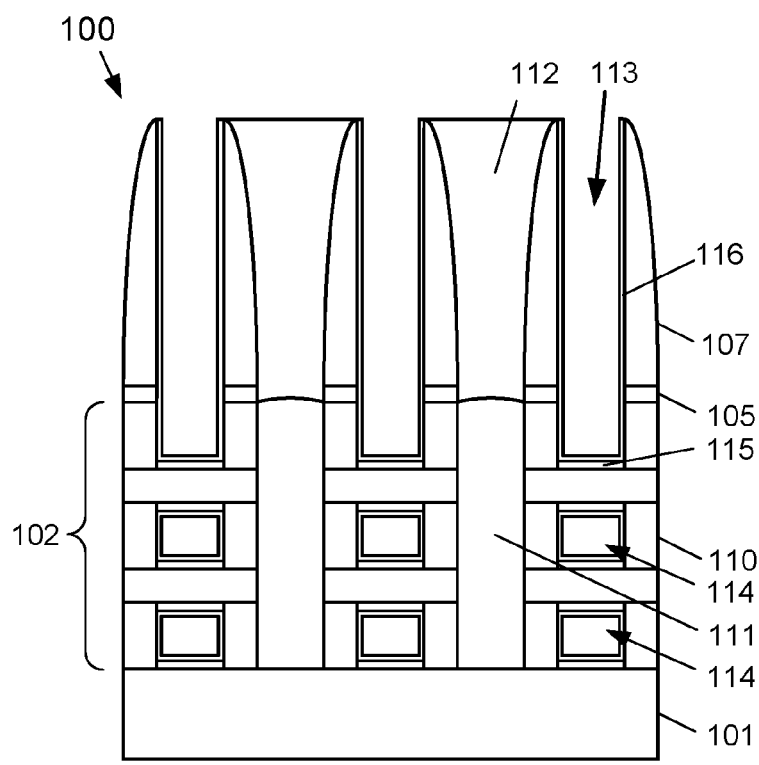

At 211 in FIG. 2, a high-k dielectric layer 116 may be formed on the oxide layer 115 using a well-known technique (FIG. 1K).

Figure 1L:
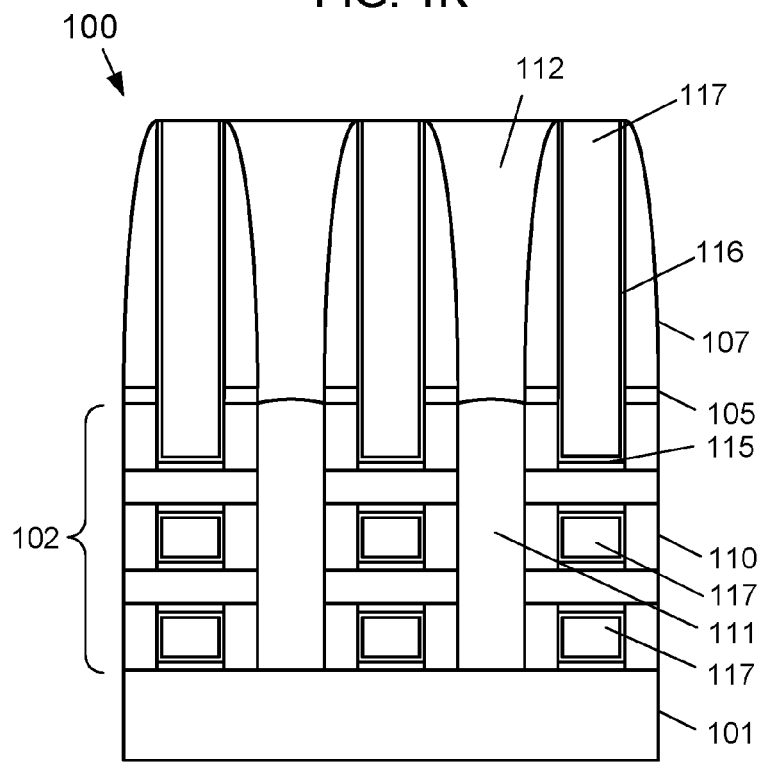

At 212 in FIG. 2, gate electrodes 117 may be formed as part of a well-known replacement gate technique (FIG. 1L).

Figure 3:
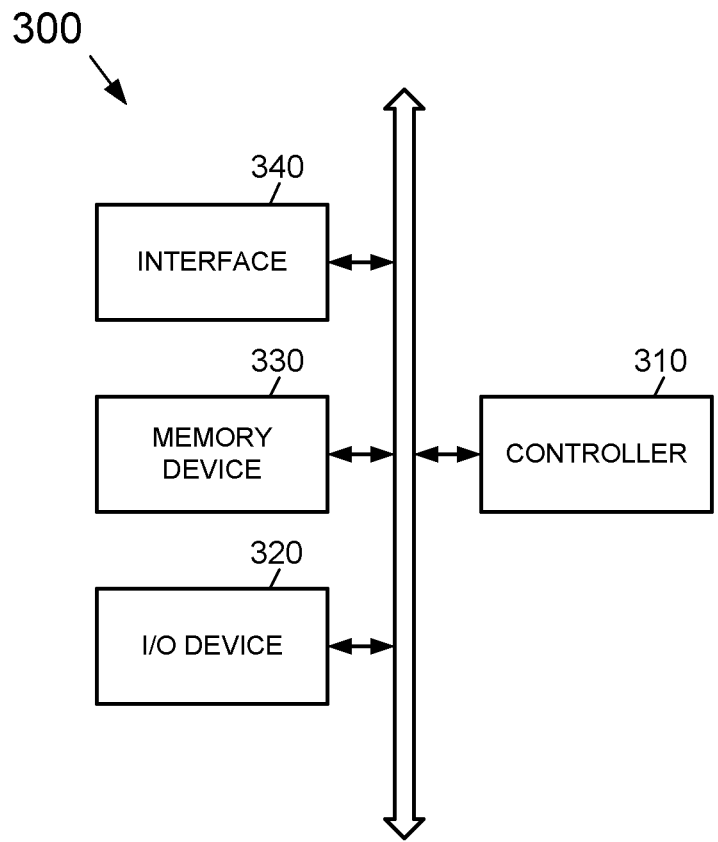
FIG. 3 depicts an electronic device that includes one or more integrated circuits (chips) that include an NS device according to the subject matter disclosed herein.

FIG. 3 depicts an electronic device 300 that includes one or more integrated circuits (chips) that include an NS device according to the subject matter disclosed herein. Electronic device 300 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 300 may include a controller 310, an input/output device 320 such as, but not limited to, a keypad, a keyboard, a display, or a touch-screen display, a memory 330, and a wireless interface 340 that are coupled to each other through a bus 350. The controller 310 may include, for example, at least one microprocessor, at least one digital signal process, at least one microcontroller, or the like. The memory 330 may be configured to store a command code to be used by the controller 310 or a user data. Electronic device 300 and the various system components including electronic device 300 may include an NS device according to the subject matter disclosed herein. The electronic device 300 may use a wireless interface 340 configured to transmit data to or receive data from a wireless communication network using a RF signal. The wireless interface 340 may include, for example, an antenna, a wireless transceiver and so on. The electronic system 300 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), and so forth.

Figure 4:
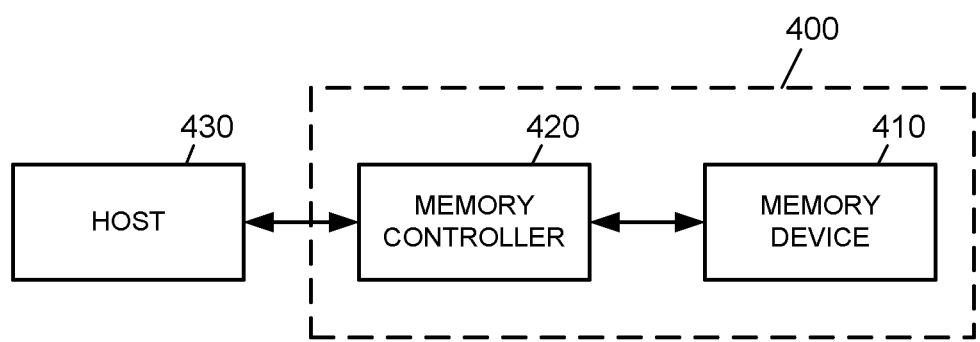
FIG. 4 depicts a memory system that may include an NS device according to the subject matter disclosed herein.

FIG. 4 depicts a memory system 400 that may include an NS device according to the subject matter disclosed herein. The memory system 400 may include a memory device 410 for storing large amounts of data and a memory controller 420. The memory controller 420 controls the memory device 410 to read data stored in the memory device 410 or to write data into the memory device 410 in response to a read/write request of a host 430. The memory controller 420 may include an address-mapping table for mapping an address provided from the host 430 (e.g., a mobile device or a computer system) into a physical address of the memory device 410. The memory device 410 may include one or more semiconductor devices that include an NS device according to the subject matter disclosed herein.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:

1. An epitaxial stack grown on an underlayer for a semiconductor device, the epitaxial stack comprising:
   a plurality of sacrificial layers, each sacrificial layer comprising BeZnSe and having a first intrinsic lattice parameter; and
   at least one channel layer comprising a material with a second intrinsic lattice parameter, the first intrinsic lattice parameter being less than or equal to the second intrinsic lattice parameter, and the at least one channel layer being disposed between and in contact with two sacrificial layers of the plurality of sacrificial layers and comprising a compressive strain or a neutral strain based on a difference between the first intrinsic lattice parameter and the second intrinsic lattice parameter.

2. The epitaxial stack according to claim 1, further comprising:
   a pair of recesses in the epitaxial stack, each recess extending from a top of the epitaxial stack to the underlayer; and
   a source/drain structure in each recess, the at least one channel layer substantially comprising a compressive strain after the source/drain structure has been formed in each recess.

3. The epitaxial stack according to claim 1, wherein the compressive strain in the at least one channel layer is further based on a layer thickness and a composition of the sacrificial layers and a layer thickness and a composition of the at least one channel layer.

4. The epitaxial stack according to claim 1, wherein the sacrificial layers further comprise a combination of BeZnSe and SiGe:C, a combination of BeZnSe and SiC, or a combination of BeZnSe, SiGe:C and SiC, and
   wherein the at least one channel layer comprises silicon.

5. The epitaxial stack according to claim 1, wherein the at least one channel layer comprises a first end and a second end,
   the epitaxial stack further comprising a source/drain structure disposed at and in contact with each of the first and second ends of the at least one channel layer.

6. The epitaxial stack according to claim 1, wherein the at least one channel layer comprises a nanosheet.

7. The epitaxial stack according to claim 1, wherein the at least one channel layer comprises a nanowire.

8. A stack for a semiconductor device, comprising:
an underlayer; and
an epitaxial stack of a plurality of sacrificial layers and at least one channel layer on the underlayer, a sacrificial layer of the plurality of sacrificial layers being in contact with the underlayer, each sacrificial layer material comprising BeZnSe and having a first intrinsic lattice parameter, the at least one channel layer comprising a material with a second intrinsic lattice parameter, the first intrinsic lattice parameter being smaller than or equal to the second intrinsic lattice parameter, and the at least one channel layer being disposed between and in contact with two sacrificial layers of the plurality of sacrificial layers and comprising a compressive strain or a neutral strain based on a difference between the first intrinsic lattice parameter and the second intrinsic lattice parameter.

9. The stack according to claim 8, wherein the sacrificial layers further comprise a combination of BeZnSe and SiGe:C, a combination of BeZnSe and SiC, or a combination of BeZnSe, SiGe:C and SiC, and
wherein the at least one channel layer comprises silicon.

10. The stack according to claim 8, wherein the at least one channel layer comprises a first end and a second end, the stack further comprising a source/drain structure disposed at and in contact with each of the first and second ends of the at least one channel layer.

11. The stack according to claim 8, wherein the at least one channel layer comprises a nanosheet.

12. The stack according to claim 8, wherein the at least one channel layer comprises a nanowire.

13. A method to form a stack for a semiconductor device, the method comprising:
providing an underlayer; and
forming an epitaxial stack of a plurality of sacrificial layers and at least one channel layer on the underlayer, a sacrificial layer of the plurality of sacrificial layers being in contact with the underlayer, each sacrificial layer comprising BeZnSe and having a first intrinsic lattice parameter, the at least one channel layer comprising a second material with a second intrinsic lattice parameter, the first intrinsic lattice parameter being smaller than or equal to the second intrinsic lattice parameter, and the at least one channel layer being disposed between and in contact with two sacrificial layers of the plurality of sacrificial layers and comprising a compressive strain based on a difference between the first intrinsic lattice parameter and the second intrinsic lattice parameter.

14. The method according to claim 13, further comprising:
forming a pair of recesses in the stack, each recess extending from a top of the stack to the underlayer; and
forming a source/drain structure in each recess, the at least one channel layer substantially comprising the compressively strain after the source/drain structure has been formed in each recess.

15. The method according to claim 13, wherein the compressive strain in the at least one channel layer is further based on a layer thickness and a composition of the sacrificial layers and a layer thickness and a composition of the at least one channel layer.

16. The method according to claim 13, wherein the sacrificial layers further comprise a combination of BeZnSe and SiGe:C, a combination of BeZnSe and SiC, or a combination of BeZnSe, SiGe:C and SiC, and
wherein the at least one channel layer comprises silicon.

17. The method according to claim 13, further comprising:
forming a dummy gate structure on the stack before forming the pair of recesses, the dummy gate structure comprising a dummy gate and spacers on sidewalls of the dummy gate, and
wherein the pair of recesses are on opposite sides of the dummy gate structure.

18. The method according to claim 17, further comprising:
removing the dummy gate after forming source/drain structures in each recess; and
removing the sacrificial layers of the stack after removing the dummy gate.

19. The method according to claim 18, further comprising forming a gate electrode in a space formed by removing the sacrificial layers of the stack and in a space formed by removing the dummy gate.

20. The method according to claim 13, wherein forming the epitaxial stack of the plurality of sacrificial layers and the at least one channel layer on the underlayer comprises forming the plurality of sacrificial layers and the at least one channel layer in an alternating sequence on the underlayer.

* * * * *